US009456530B2

(12) United States Patent
Nishimura et al.

(10) Patent No.: US 9,456,530 B2
(45) Date of Patent: Sep. 27, 2016

(54) DC-DC CONVERTER

(71) Applicants: AUTONETWORKS TECHNOLOGIES, LTD, Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Tsuguo Nishimura, Yokkaichi (JP); Shigeki Yamane, Yokkaichi (JP); Kazuhide Kitagawa, Yokkaichi (JP); Manabu Hashikura, Yokkaichi (JP); Youzou Nishiura, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 152 days.

(21) Appl. No.: 14/355,728

(22) PCT Filed: Nov. 20, 2012

(86) PCT No.: PCT/JP2012/080042
§ 371 (c)(1),
(2) Date: May 1, 2014

(87) PCT Pub. No.: WO2013/077311
PCT Pub. Date: May 30, 2013

(65) Prior Publication Data
US 2014/0321065 A1    Oct. 30, 2014

(30) Foreign Application Priority Data
Nov. 21, 2011    (JP) ................. 2011-253973

(51) Int. Cl.
*H05K 7/20*    (2006.01)
*H05K 1/02*    (2006.01)
(Continued)

(52) U.S. Cl.
CPC ............... *H05K 7/209* (2013.01); *H02M 3/28* (2013.01); *H02M 3/337* (2013.01); *H05K 1/0203* (2013.01); *H05K 7/1432* (2013.01); *H02M 3/33576* (2013.01); *H02M 7/003* (2013.01)

(58) Field of Classification Search
CPC . H01L 23/3107; H01L 23/645; H01L 23/36; H01F 27/22; H01F 27/2876; H01F 27/08; H01F 27/085; H05K 7/209; H05K 1/0262; H05K 7/2089; H05K 7/1432; H05K 7/2039; H05K 7/20254; H05K 7/14; H05K 7/02
USPC ........ 361/688, 689, 690, 704, 707, 709–711, 361/714, 715, 728–730, 807–811, 831; 363/141
See application file for complete search history.

(56) References Cited

U.S. PATENT DOCUMENTS 3,857,044 A * 12/1974 Papoi .................. H05K 7/1432
                                              307/9.1
4,394,706 A *  7/1983 Crafts ..................... H01F 27/06
                                              307/10.1

(Continued)

FOREIGN PATENT DOCUMENTS

DE    10 2004 030 457 A1    1/2006
JP       A-06-288581        10/1994
(Continued)

OTHER PUBLICATIONS
Feb. 12, 2013 International Search Report issued in International Application No. PCT/JP2012/080042 (with translation).
(Continued)

*Primary Examiner* — Adam B Dravininkas
(74) *Attorney, Agent, or Firm* — Oliff PLC

(57) ABSTRACT

A DC-DC converter is provided with a transformer provided with a primary coil and a secondary coil; switching elements connected to the primary coil for switching the flow of electrical current to the primary coil; rectifying elements connected to the secondary coil; a case having a first accommodating portion in which the transformer is accommodated and a second accommodating portion in which the switching elements and the rectifying elements are accommodated; and a metal heat sink mounted on the case, the metal heat sink being thermally connected to the switching elements and the rectifying elements and having a radiator portion exposed on the outer surface of the case.

24 Claims, 16 Drawing Sheets

(51) Int. Cl.
*H02M 3/28* (2006.01)
*H05K 7/14* (2006.01)
*H02M 3/337* (2006.01)
*H02M 3/335* (2006.01)
*H02M 7/00* (2006.01)

(56) References Cited

U.S. PATENT DOCUMENTS

| | | | | |
|---|---|---|---|---|
| 4,562,382 A | * | 12/1985 | Elliott | H05B 41/2822 315/205 |
| 4,639,834 A | * | 1/1987 | Mayer | H05K 7/02 361/623 |
| 4,751,398 A | * | 6/1988 | Ertz, III | H02J 9/065 307/44 |
| 4,872,102 A | * | 10/1989 | Getter | H05K 7/209 307/150 |
| 5,170,336 A | * | 12/1992 | Getter | H05K 7/20909 361/697 |
| 5,635,828 A | * | 6/1997 | Yoshizawa | H01F 1/15308 323/362 |
| 6,078,155 A | * | 6/2000 | Tominaga | H05K 7/1432 318/293 |
| 7,715,195 B2 | * | 5/2010 | Bremicker | H02S 40/32 174/50 |

FOREIGN PATENT DOCUMENTS

| | | |
|---|---|---|
| JP | A-10-205830 | 8/1998 |
| JP | B2-3544307 | 4/2004 |
| JP | B2-3641603 | 1/2005 |

OTHER PUBLICATIONS

Mar. 18, 2016 Office Action issued in German Patent Application No. 11 2012 004 841.5.

* cited by examiner

DC-DC CONVERTER

This application is the national phase of PCT International Application No. PCT/JP2012/080042 that has an International filing date of Nov. 20, 2012 and designated the United States of America and claims priority to Japanese Patent App. No. JP 2011-253973 that was filed on Nov. 21, 2011. The disclosure of the prior applications is hereby incorporated by reference herein in their entirety.

BACKGROUND

DC-DC converters installed in vehicles, such as the one disclosed in Japanese Patent No. 3544307, has been known. This DC-DC converter accommodates within its case a transformer, switching elements connected to the primary coil of the transformer for switching the flow of electrical current to the primary coil, and rectifying elements connected to the secondary coil of the transformer.

Due to the enlargement of the cabin space and the higher performance of vehicles in recent years, the space for mounting DC-DC converters is increasingly limited. This calls for further miniaturization of DC-DC converters. If the DC-DC converter is miniaturized, the electronic components (the transformer, the switching elements, the rectifying elements, etc.) become more densely populated in the case. The heat generated by these and adjacent electronic components may potentially raise the temperatures of the electronic components above their heat-resistant limits. This can cause a problem particularly if the switching elements and the rectifying elements, which have relatively low heat-resistant temperatures, and the transformer, which has a relatively high heat-resistant temperature, are arranged close to one another in the case.

To address this issue, a metal heat sink may be mounted on the substrate to which the electronic components, such as the switching elements and the rectifying elements, are connected in order to cool the interior of the case. This was expected to protect the electronic components with relatively low heat-resistant temperatures. Such technology is known from Japanese Patent No. 3641603.

SUMMARY

Technical Problem

According to the foregoing arrangement, however, as the metal heat sink attached to the substrate covers the entire surface of the substrate, this creates the problem of increasing the weight of the DC-DC converter.

Provided herein is a DC-DC converter with a reduced weight in which the electronic components with relatively low heat-resistant temperatures are protected.

Solution to Problem

Provided herein is a DC-DC converter, including: a transformer having a primary coil and a secondary coil; switching elements connected to the primary coil for switching the flow of electrical current to the primary coil; rectifying elements connected to the secondary coil; a case having a first accommodating portion in which the transformer is accommodated and a second accommodating portion in which the switching elements and the rectifying elements are accommodated; a metal heat sink attached to the case, the metal heat sink being thermally connected to the switching elements and the rectifying elements and having a radiator portion exposed on an outer surface of the case.

The transformer, which has a relatively high heat-resistant temperature, can be separately accommodated from the switching elements and the rectifying elements, which have relatively low heat-resistant temperatures, in the case. This limits the heat generated by the transformer from being transferred to the switching elements and the rectifying elements. This allows for protection of the switching elements and the rectifying elements, which have relatively low heat-resistant temperatures.

As the switching elements and the rectifying elements are thermally connected to the heat sink, the heat generated by the switching elements and the rectifying elements is swiftly transferred to the heat sink. This can limit the area in close proximity to the switching elements and the rectifying elements from reaching high temperature. The heat transferred to the heat sink is thermally conducted through the heat sink and dissipated to the outside of the case from the radiator portion. This can limit the area in close proximity to the switching elements and the rectifying elements from reaching high temperature. This allows for reliable protection of the switching elements and the rectifying elements, which have relatively low heat-resistant temperatures.

The heat sink is thermally connected to the switching elements and the rectifying elements but not to the transformer. This allows the heat sink to be smaller than if the heat sink is thermally connected to all of the transformer, the switching elements, and the rectifying elements. Such miniaturization of the metal heat sink allows for weight reduction of the DC-DC converter.

The following are preferred embodiments.

Preferably, the case is provided with inlet ports and outlet ports that place the first accommodating portion in communication with an outside.

According to the foregoing embodiment, inlet ports and outlet ports are formed in the case that place the first accommodating portion in communication with an outside. This allows air flowing into the first accommodating portion through the inlet ports to cool the transformer and be discharged through the outlet port after heat from the transformer is transferred to the air. This further limits the heat generated by the transformer from being transferred to the switching elements and the rectifying elements. This allows for reliable protection of the switching elements and the rectifying elements, which have relatively low heat-resistant temperatures.

Preferably, a choke coil connected to the secondary coil is also accommodated in the first accommodating portion.

According to the embodiment, this smoothes the output current of the DC-DC converter.

When energized, the choke coil generates heat. As the choke coil is accommodated in the first accommodating portion, this can limit the heat generated by the choke coil from being transferred to the switching elements and the rectifying elements.

Furthermore, the heat generated by the choke coil is cooled by the air flowing into the case through the inlet port. The air, to which the heat from the choke coil is transferred, is discharged from the outlet port to the outside of the case. This further limits the heat generated by the choke coil from being transferred to the switching elements and the rectifying elements.

Preferably, the transformer includes a ferrite magnetic core and the choke coil includes a powder magnetic core.

According to the foregoing embodiment, as the powder magnetic core experiences no degradation of magnetic performance as a choke coil in relatively high temperature, the heat resistance of the choke coil can be enhanced.

Using ferrite magnetic core, the transformer experiences no degradation of performance as a transformer when heated to relatively high temperature. This can enhance the heat resistance property of the DC-DC converter.

Preferably, a capacitor is connected to the primary coil and a capacitor accommodating portion in which the capacitor is accommodated is formed at a position in the second accommodating portion that is spaced apart from the switching elements and the rectifying elements.

According to the foregoing embodiment, the capacitor can be protected from the heat generated by the switching elements.

Preferably, the case includes a lower case opened upward and an upper cover that shuts the lower case from above, and an upper edge of a lower-side partition formed in the lower case abuts against a lower edge of an upper-side partition formed in the upper cover, thereby partitioning the first accommodating portion from the second accommodating portion.

According to the foregoing embodiment, the first accommodating portion can be partitioned from the second accommodating portion by assembling the lower case and the upper cover together.

Preferably, the case includes a lower case opened upward, an inner cover that covers the first accommodating portion formed in the lower case from above, and an upper cover that covers the lower case and the inner cover from above, wherein inlet ports are formed in the lower case that place the first accommodating portion in communication with an outside, wherein inner cover outlet ports are formed in the inner cover that place spaces inside the first accommodating portion, the inner cover, and the upper cover in communication with one another, and outlet ports are formed in the upper cover that place the first accommodating portion in communication with an outside.

According to the foregoing embodiment, the first accommodating portion can be partitioned from the second accommodating portion by assembling the lower case and the inner cover together.

Moreover, as the inner cover outlet ports place the spaces inside the first accommodating portion, the inner cover, and the upper cover in communication with one another, the air in the first accommodating portion, after flowing out of the inner cover outlet ports, is discharged to the outside of the case through the outlet ports of the upper cover. This further limits the heat generated by the transformer from being transferred to the switching elements and the rectifying elements. This allows for reliable protection of the switching elements and the rectifying elements, which have relatively low heat-resistant temperatures.

Preferably, the outlet ports are arranged out of alignment with the inner cover outlet ports.

According to the foregoing embodiment, if water enters through the outlet ports, the water is limited from entering the interior of the inner cover outlet ports. This improves the waterproofness of the DC-DC converter.

Advantageous Effects

Electronic components with relatively low heat-resistant temperatures can be protected in a DC-DC converter while reducing the weight of the DC-DC converter.

DETAILED DESCRIPTION OF THE EMBODIMENTS

Embodiment 1

Embodiment 1 will be described with reference to FIGS. 1-10.

Circuit Configuration

Figure 1:
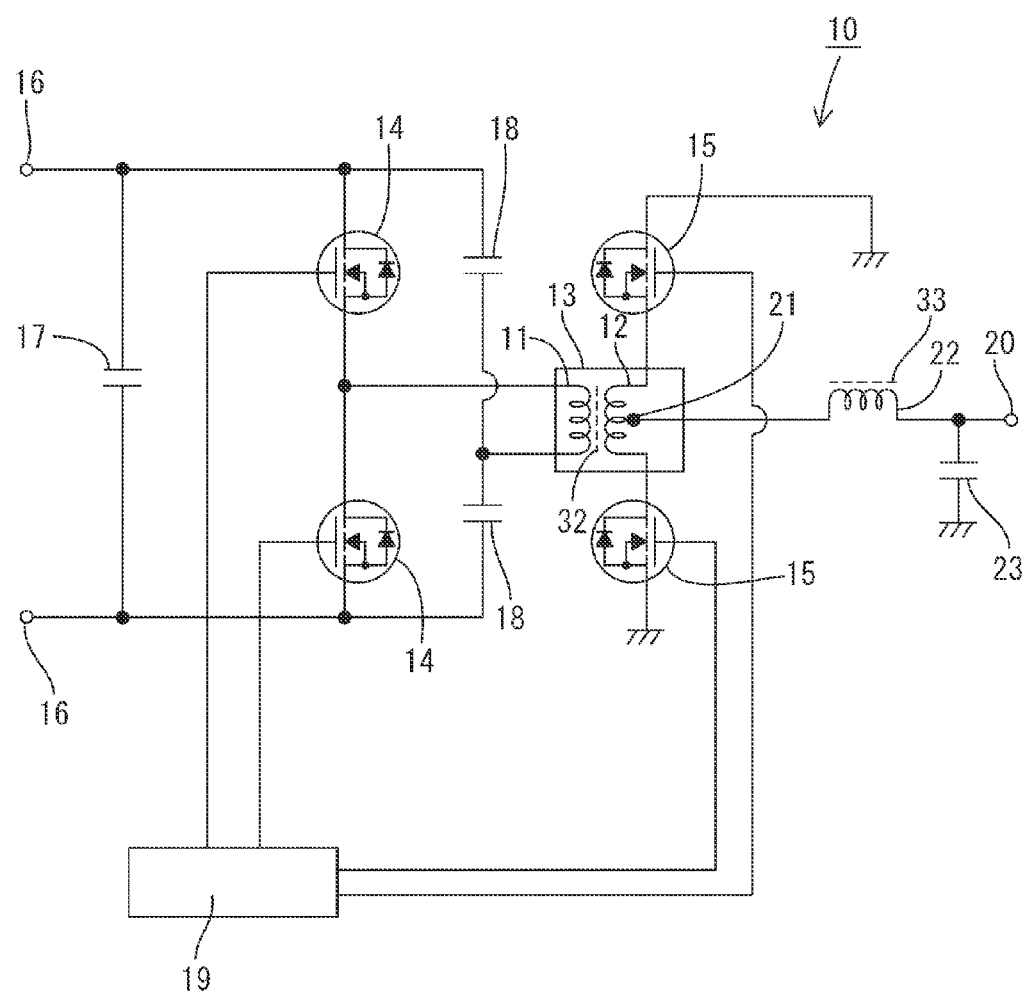
FIG. 1 is a block diagram showing the circuit configuration of a DC-DC converter according to Embodiment 1.

As shown in FIG. 1, a DC-DC converter 10 according to the present embodiment includes a transformer 13 having a primary coil 11 and a secondary coil 12, switching elements 14 connected to the primary coil 11 for switching the flow of electrical current to the primary coil 11, and rectifying elements 15 connected to the secondary coil 12 for rectifying output current outputted from the secondary coil 12.

An input-side smoothing capacitor 17 (capacitor) is connected between a pair of input terminals 16. A pair of switching elements 14 constitutes an inverter circuit for converting direct current inputted from the pair of input terminals 16 into alternating current. In the present embodiment, the switching elements 14 are composed of power MOSFETs. A pair of capacitors 18 is connected to the pair of switching elements 14 and constitutes a half bridge. The pair of switching elements 14 is turned on and off by the controller 19. The capacitors 18 are applicable to other types of circuits, such as a full bridge circuit, a forward circuit, etc.

A rectifying element 15 is connected to each of the output terminals 20 of the secondary coil 12. In the present embodiment, the rectifying elements 15 comprise a FET. The rectifying elements 15 are configured to be turned on and off by the controller 19 to rectify electric current flowing through the secondary coil 12.

A choke coil 22 is connected to the center tap 21 of the secondary coil 12. An output terminal 20 is connected to the choke coil 22. Direct current is outputted from this output terminal 20. An output-side smoothing capacitor 23 is connected between the choke coil 22 and the output terminal 20.

Configuration of the DC-DC Converter 10

Figure 2:
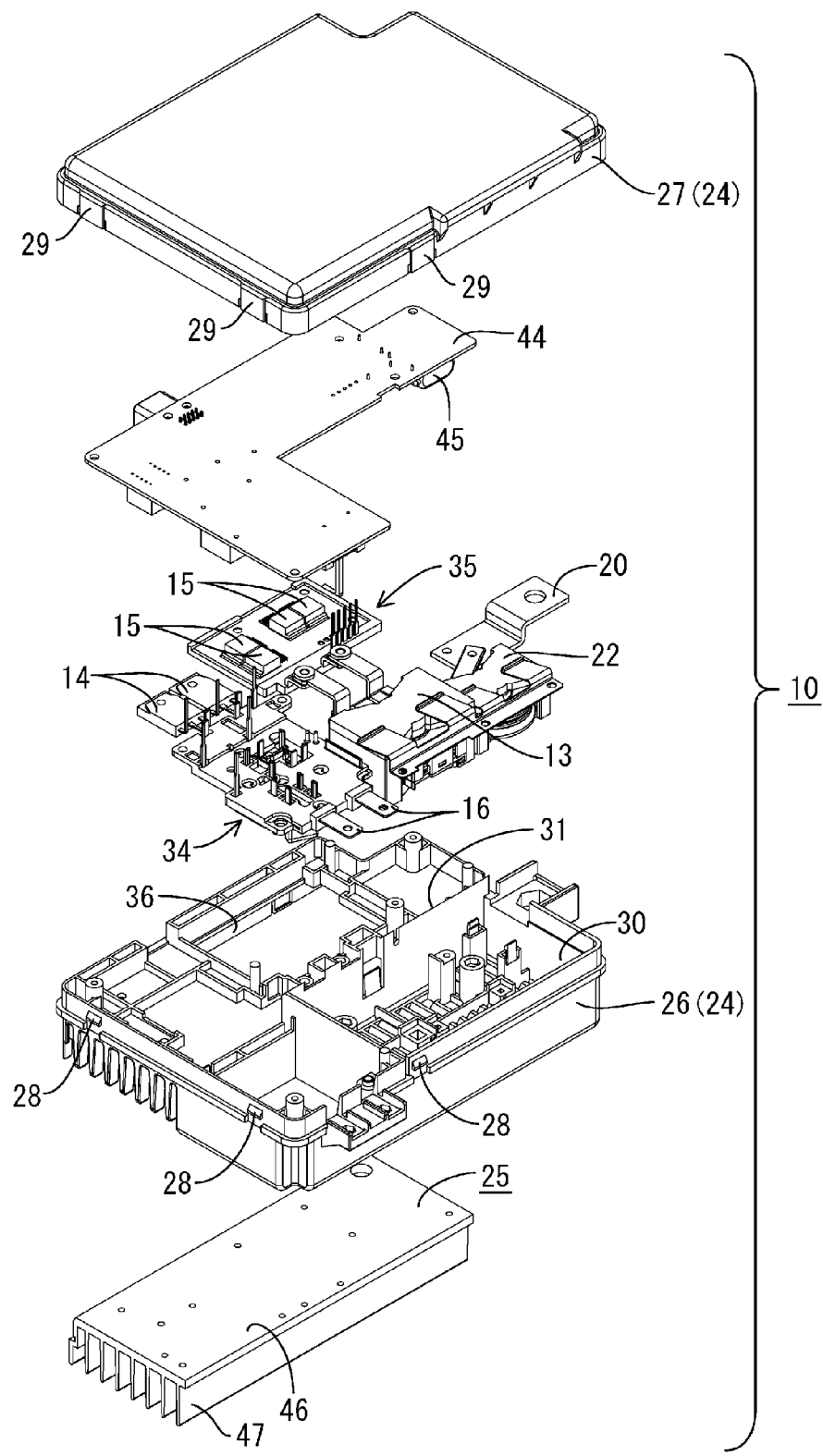
FIG. 2 is an exploded perspective view of the DC-DC converter.
Figure 3:
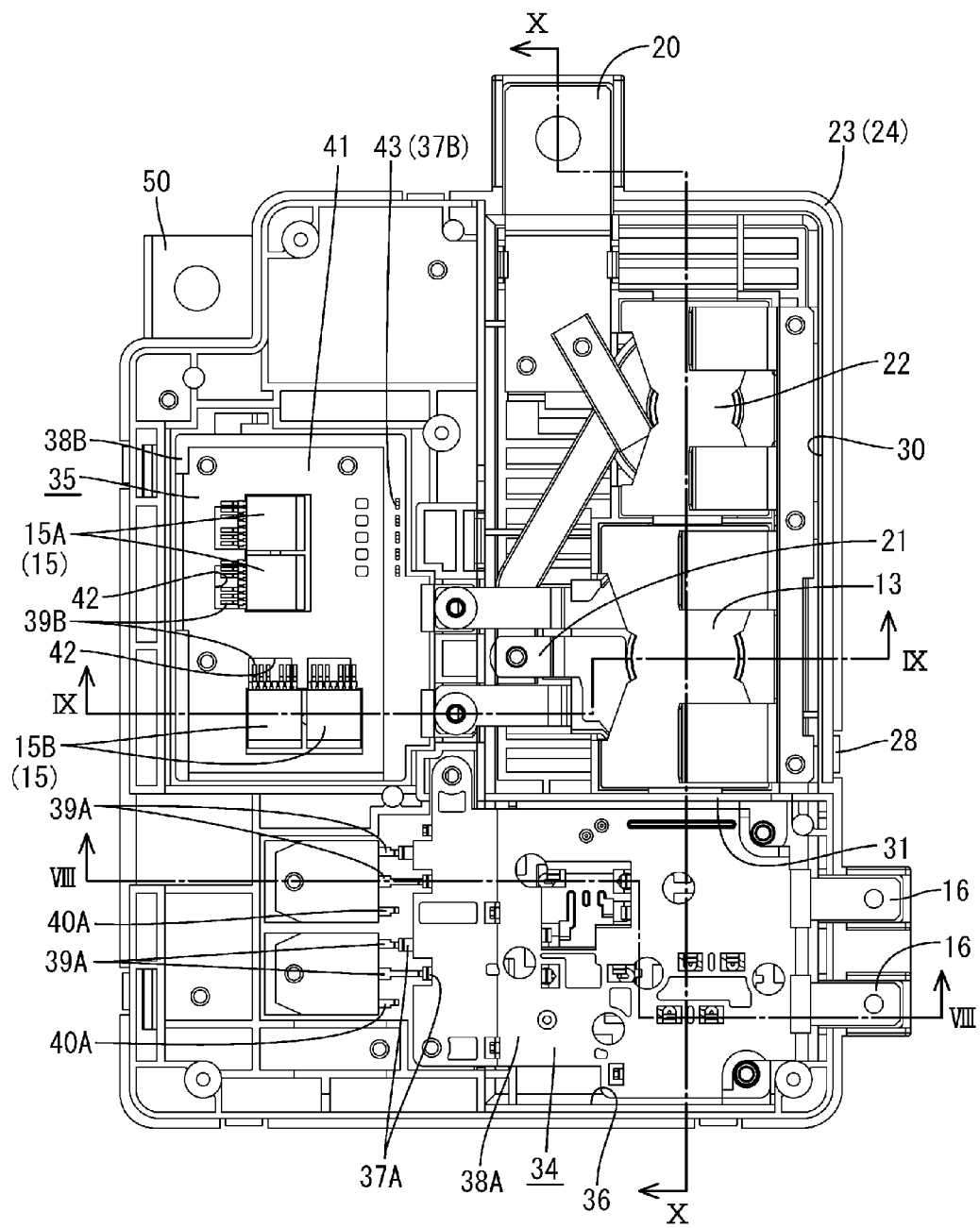
FIG. 3 is a plan view of the DC-DC converter with the upper cover and the second circuit board removed.

The configuration of the DC-DC converter 10 according to the present embodiment will be described hereinafter with reference to FIGS. 2-10. The DC-DC converter 10 is mounted in a vehicle, such as an electric car or a hybrid car, for converting high-voltage direct current into low-voltage direct current. The DC-DC converter 10 according to the present embodiment reduces the voltage of direct current from 200V to 14V. The transformer 13, the switching elements 14, and the rectifying elements 15 are accommodated in the case 24 of the DC-DC converter 10. Additionally, a heat sink 25 is mounted on the case 24. Throughout the description below, the direction toward the top in FIG. 2 is referred to as upward or above, and the direction toward the bottom in FIG. 2 is referred to as downward. Also, the direction toward the left in FIG. 3 is referred to as leftward, and the direction toward the right of FIG. 3 is referred to as rightward. The direction toward the bottom in FIG. 3 is referred to as forward, and the direction toward the top in FIG. 3 is referred to as rearward.

Case 24

The case 24 includes a lower case 26 made of a synthetic resin that is opened upward and an upper cover 27 made of a synthetic resin that is set on the lower case 26 from above. The case 24 has an approximate rectangular shape as seen from above. The lower case 26 and the upper cover 27 are assembled together by elastically engaging lock portions 28 formed on the lower case 26 and lock receiving portions 29 formed on the upper cover 27.

Figure 4:
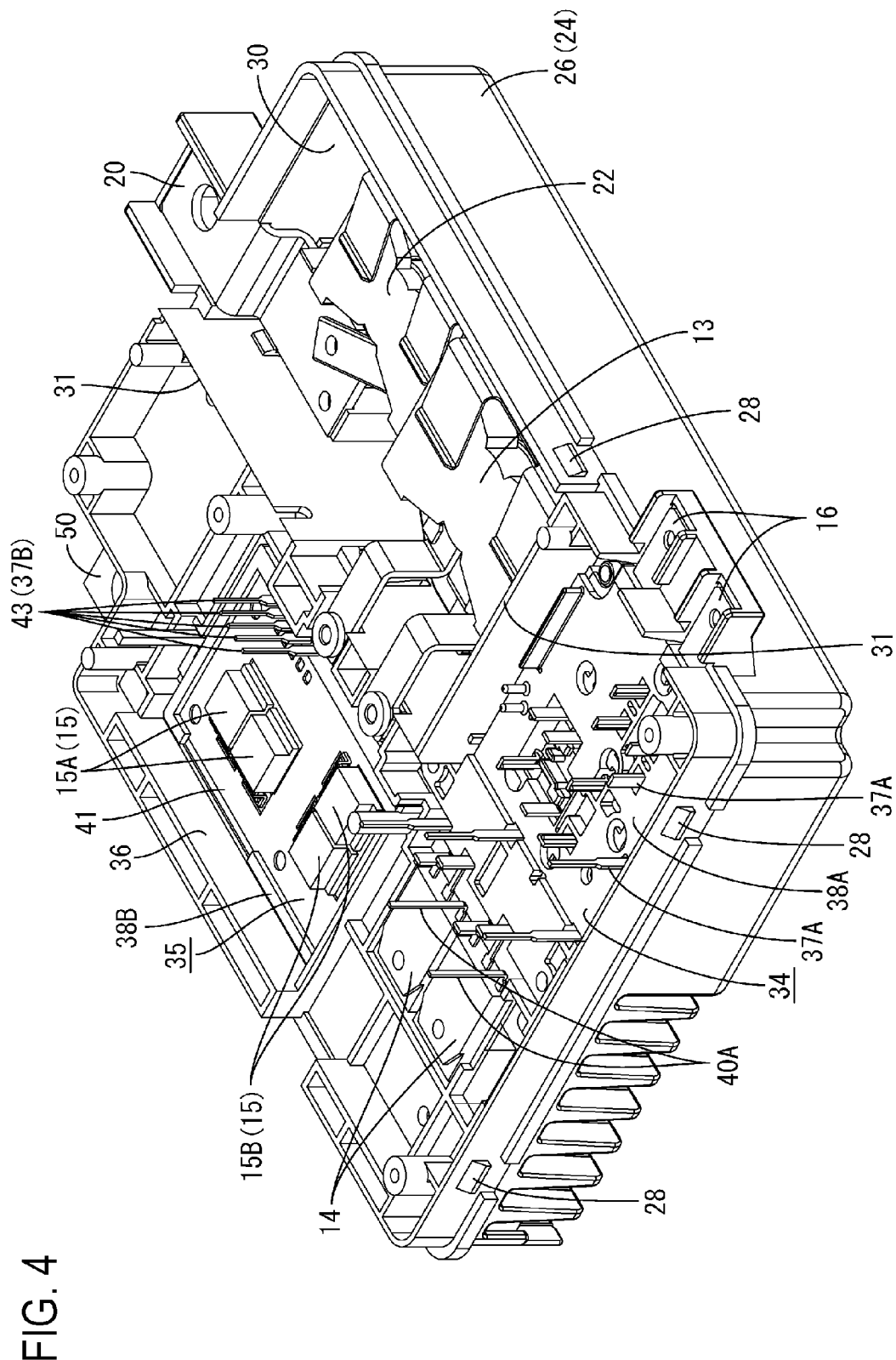
FIG. 4 is a perspective view of the DC-DC converter with the upper cover and the second circuit board removed.

As shown in FIGS. 3 and 4, a first accommodating portion 30 that accommodates the transformer 13 is formed in the region of the lower case 26 that extends approximately half of the lateral width of the lower case 26 from its right edge and approximately two thirds of the front-rear direction of the lower case 26 from its rear edge. The first accommodating portion 30 is partitioned from a second accommodating portion 36, which will be described below, by a lower-side partition 31 rising from the bottom wall of the lower case 26.

The transformer 13 is accommodated in the front region of the first accommodating portion 30. The transformer 13 includes a primary coil 11 and a secondary coil 12 with wires (not shown) wound around a ferrite magnetic core 32. The term "ferrite" generally refers to ceramics whose main component is iron oxide. As used in the specification, however, it refers to a non-conductive member having a high permeability and ferromagnetism.

The choke coil 22 is accommodated in the rear region of the first accommodating portion 30. The choke coil 22 is comprised of a wire (not shown) wound around a powder magnetic core 33 (dust core). As used herein, the powder magnetic core 33 refers to a magnetic core formed in a desired shape by filling in a metal mold and pressure-molding powder that includes magnetic powder, such as pure iron or soft magnetic alloy, and a suitable amount of binder, such as synthetic resin, added thereto.

As shown in FIG. 3, one end of the choke coil 22 is connected to the center tap 21 of the transformer 13. Also, the other end of the choke coil 22 is connected to the output terminal 20. The output terminal 20 is fabricated by press-working sheet metal into a desired shape. The output terminal 20 has a rectangular shape as seen from above and projects rearward from the rear end of the lower case 26.

As shown in FIG. 3, formed in the region of the lower case 26 other than where the first accommodating portion 30 is provided is a second accommodating portion 36 that accommodates a primary module 34 in which the switching elements 14 are connected to the primary coil 11 and a secondary module 35 in which the rectifying elements 15 are connected to the secondary coil 12. The second accommodating portion 36 has an approximate L-shape as seen from above.

Primary Module 34

The primary module 34 is fabricated by molding insulating synthetic resin 38A with a plurality of bus bars 37A. The bus bars 37A are fabricated by press-working sheet metal into a desired shape. The metal for forming the bus bars 37A may be selected from any suitable metals, including copper and copper alloy, as required. The surfaces of the bus bars 37A may be plated with any metal layer, such as tin and nickel, as required.

A pair of bus bars 37A protrudes rightward as the input terminals 16 from the right edge of the primary module 34. These input terminals 16 are electrically connected to the on-vehicle power source (not shown).

The switching elements 14 include power terminals 39A that carry current inputted at the input terminals 16 and a control terminal 40A that carries control signals for turning the switching elements 14 on and off. In the present embodiment, the power terminals 39A comprise a drain terminal and a source terminal. The control terminals 40A comprise a gate terminal. The current flowing from the drain terminal to the source terminal is turned on and off by controlling the voltage between the gate terminal and the source terminal. The power terminals 39A of the switching elements 14 are connected to the bus bars 37A exposed on an edge of the synthetic resin 38A. The control terminals 40A of the switching elements 14 are bent perpendicularly upward.

The input-side smoothing capacitor 17 and the capacitors 18 are provided on the under surface of the primary module 34. The input-side smoothing capacitor 17 and the capacitors 18 are connected to the bus bars 37A by a known technique, such as soldering.

Secondary Module 35

The secondary module 35 is fabricated by molding a plurality of bus bars 37B and a first circuit board 41 laminated on the bus bars 37B via an insulating layer into shape with insulating synthetic resin 38B. Conductive paths (not shown) are formed on one or both of the top and under surfaces of the first circuit board 41 by a printed-wiring technique. The upper surfaces of the bus bars 37B are exposed through the windows 42 formed by penetrating the first circuit board 41.

A pair of bus bars 37B protrudes rightward as secondary input terminals 16A from the right edge of the secondary module 35. The secondary input terminals 16A are connected to the output terminals 20A of the secondary coil 12 and receive output current from the secondary coil 12.

Five bus bars 37B protrude upward as secondary control terminals 43 on the right edge of the secondary module 35. The secondary control terminals 43 are connected to a secondary circuit board 44, which will be described below, and receive control signals for turning the rectifying elements 15 on and off.

The rectifying elements 15 include power terminals 39B that carry output current outputted from the secondary coil 12 and control terminals 40B that carry control signals for turning the rectifying elements 15 on and off. In the present embodiment, four rectifying elements 15 are connected to the secondary module 35. As shown in FIG. 3, the pair of rectifying elements 15A arranged lengthwise in the rear portion of the first circuit board 41 is connected in parallel to one of the output terminals 20 of the secondary coil 12. Furthermore, the pair of rectifying elements 15B arranged laterally in the front portion of the first circuit board 41 is connected in parallel to the other of the output terminals 20 of the secondary coil 12.

One of the power terminals 39B of the rectifying elements 15 is connected by a known technique, such as soldering, to the bus bar 37B exposed through the window 42. The control terminals 40B of the rectifying elements 15 are connected by a known technique, such as soldering, to the conductive paths formed on the top surface of the first circuit board 41.

Second Circuit Board 44

Figure 5:
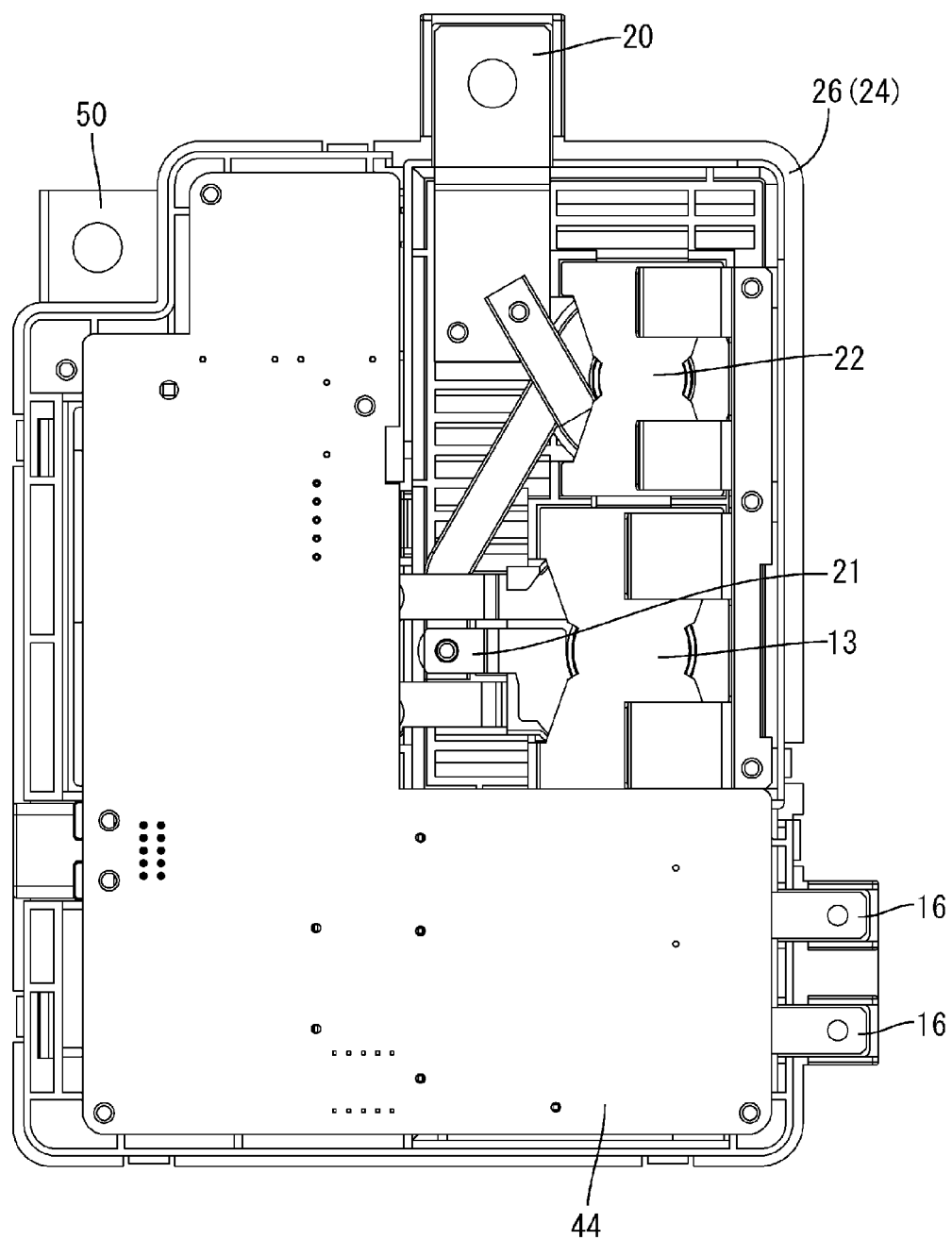
FIG. 5 is a plan view showing the DC-DC converter with the upper cover removed.
Figure 6:
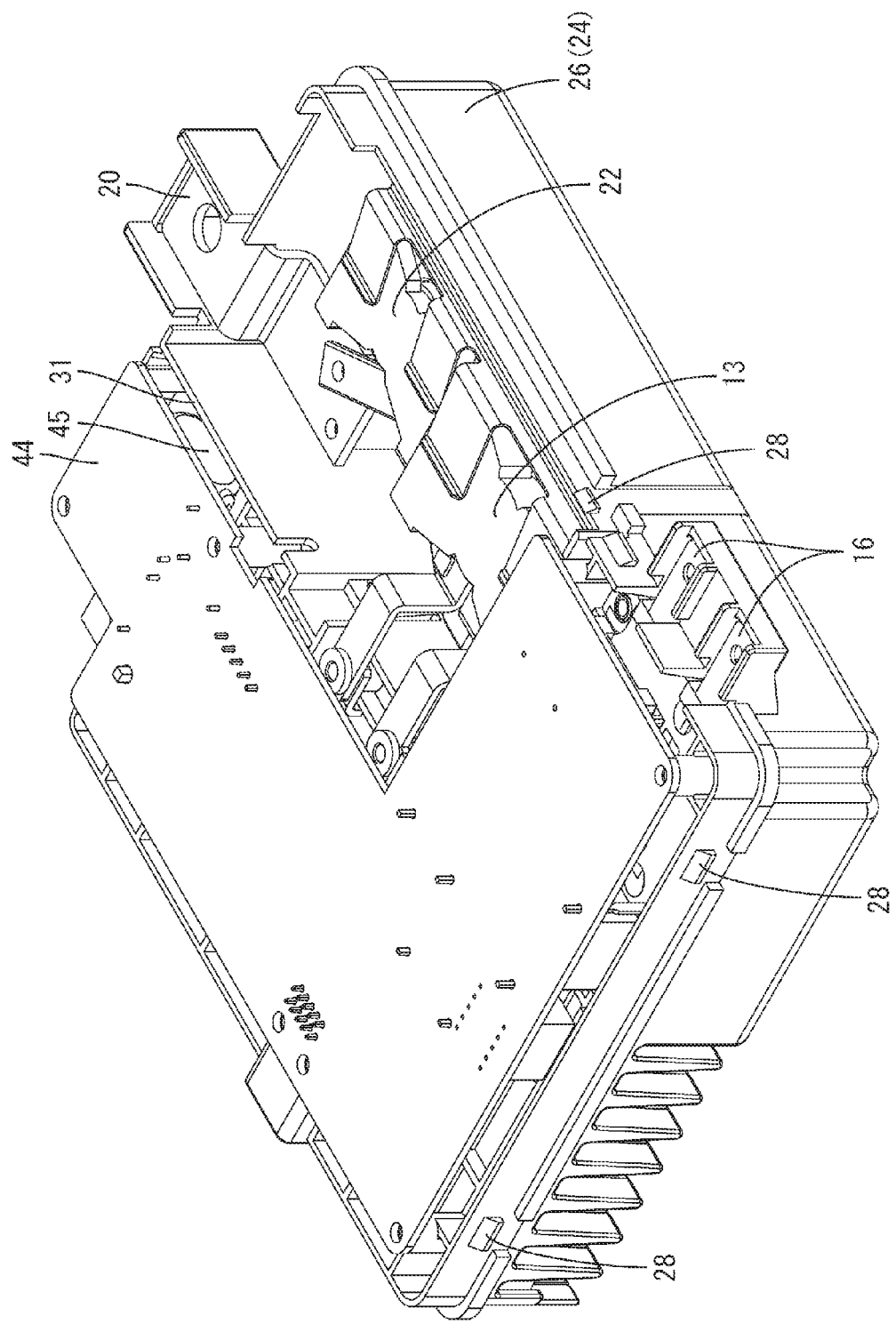
FIG. 6 is a perspective view showing the DC-DC converter with the upper cover removed.
Figure 7:
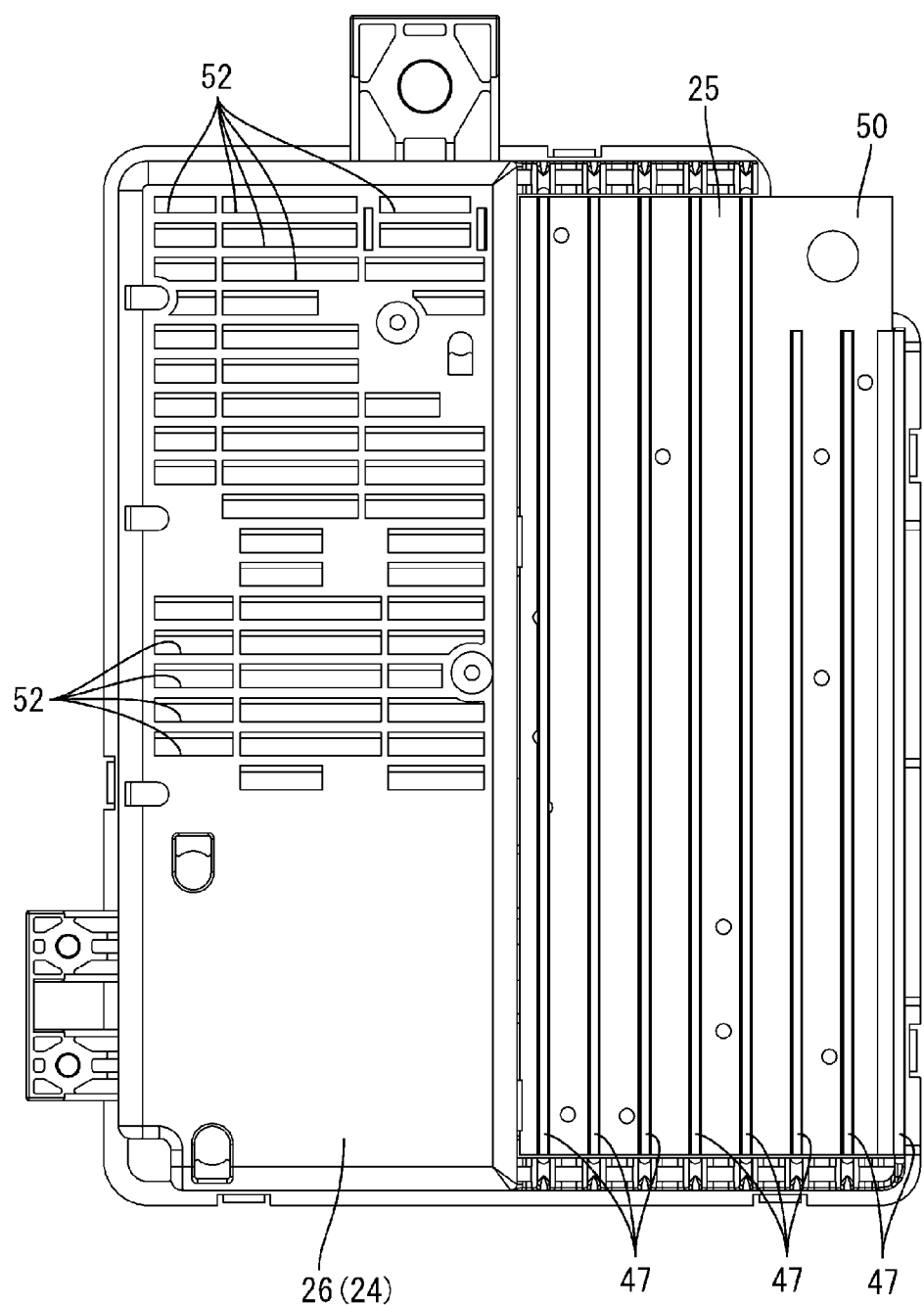
FIG. 7 is a bottom view of the DC-DC converter.

As shown in FIGS. 5 and 6, in the lower case 26, the second circuit board 44 is disposed above and covers the second accommodating portion 36. The second circuit board 44 has an approximate L-shape as seen from above. Conductive paths (not shown) are formed on the top and under surfaces of the second circuit board 44 by a printed-wiring technique. An electronic component 45 is connected to the conductive paths on the under surface of the second circuit board 44. Formed on the secondary circuit board 44 is a control circuit that carries control signals for turning the switching elements 14 and the rectifying elements 15 on and off. The controller 19 may be disposed on the second circuit board 44, or control signals transmitted from the controller 19 disposed outside of the DC-DC converter 10 may be provided to the second circuit board 44. The second circuit board 44 may also have a circuit different from the control circuit formed thereon.

Heat Sink 25

As shown in FIG. 2, the left half of the second accommodating portion 36 is opened downward. This opening is closed with the metal heat sink 25 (see FIG. 7). The heat sink 25 is formed by extrusion or die-casting of aluminum or aluminum alloy. The heat sink 25 includes a tabular base portion 46 having a rectangular shape as seen from above and a radiator portion 47 exposed to the outside of the lower case 26 from the under surface of the base portion 46. The radiator portion 47 is formed with fins extending lengthwise and laterally spaced apart from one another.

Figure 8:
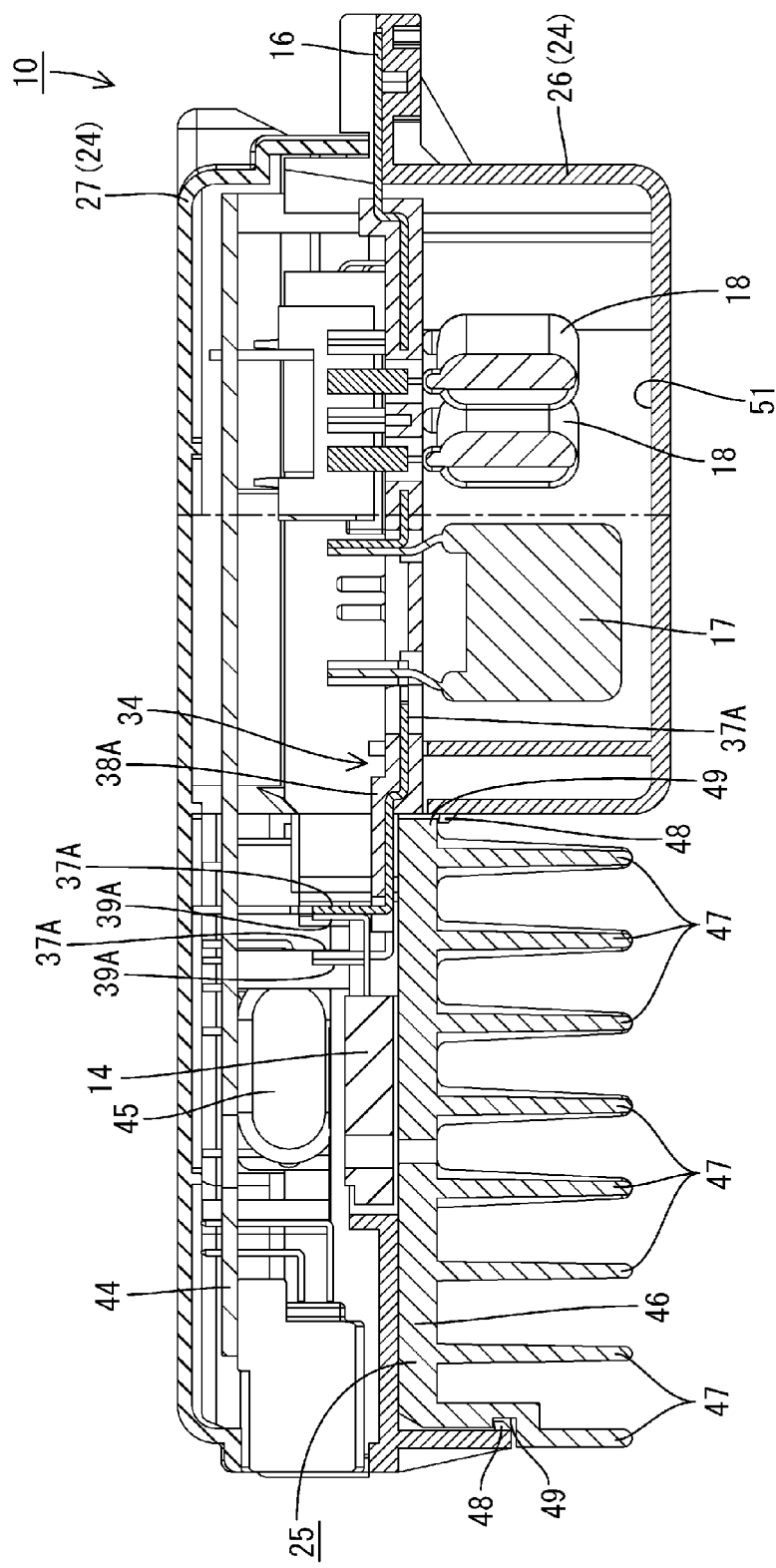
FIG. 8 is a cross sectional view of the DC-DC converter taken along line VIII-VIII of FIG. 3.

As shown in FIG. 8, the heat sink 25 is integrally assembled by elastically engaging the engaging portions 48 of the lower case 26 with the engagement receiving portions 49 formed in the positions on the heat sink 25 that correspond to the positions of the engaging portions 48.

As shown in FIG. 8, the switching elements 14 are mounted on the top surface of the base portion 46 of the heat sink 25 via an insulating synthetic resin layer (not shown). Any material, such as adhesive, adhesive sheet, insulating sheet, etc., may be selected for the synthetic resin layer according to the needs. This provides a thermal connection between the switching elements 14 and the heat sink 25. In other words, the heat generated in the switching elements 14 is transferred to the synthetic resin layer and then to the heat sink 25 from the synthetic resin layer.

Figure 9:
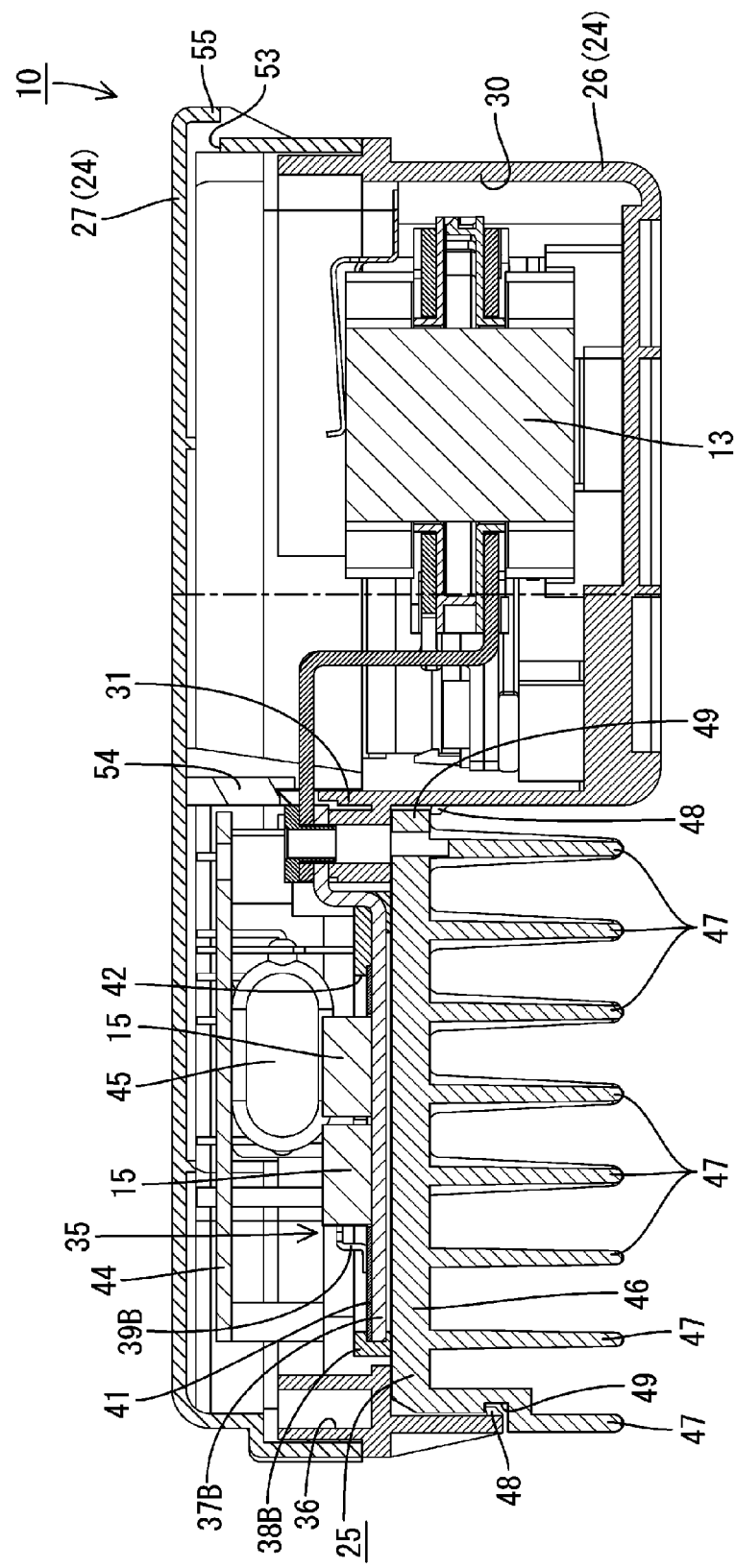
FIG. 9 is a cross sectional view of the DC-DC converter taken along line IX-IX of FIG. 3.

As shown in FIG. 9, the other power elements (not shown) are formed on the under surfaces of the rectifying elements 15 and connected to the bus bars 37B by a known technique, such as soldering. The bus bars 37B are mounted on the top surface of the base portion 46 of the heat sink 25 via an insulating synthetic resin layer (not shown). Any material, such as adhesive, adhesive sheet, insulating sheet, etc., may be selected for the synthetic resin layer according to the needs. This provides a thermal connection between the rectifying elements 15 and the heat sink 25. In other words, the heat generated in the rectifying elements 15 is transferred to the synthetic resin layer and then to the heat sink 25 from the synthetic resin layer.

In the present embodiment, the heat sink 25 is used as the conductive path for grounding. A ground terminal 50 is formed at the upper left portion of the heat sink 25. This ground terminal 50 is adapted to be in electrical connection with the vehicle body (not shown).

Capacitor Accommodating Portion 51

As shown in FIG. 8, formed in the lower case 26 below the primary module 34 is a capacitor accommodating portion 51 that accommodates the input-side smoothing capacitor 17 and the capacitors 18. As such, the switching elements 14 are separated from the input-side smoothing capacitor 17 and the capacitors 18 by the synthetic resin 38A that forms the primary module 34.

Inlet Ports 52 and Outlet Ports 53

Figure 10:
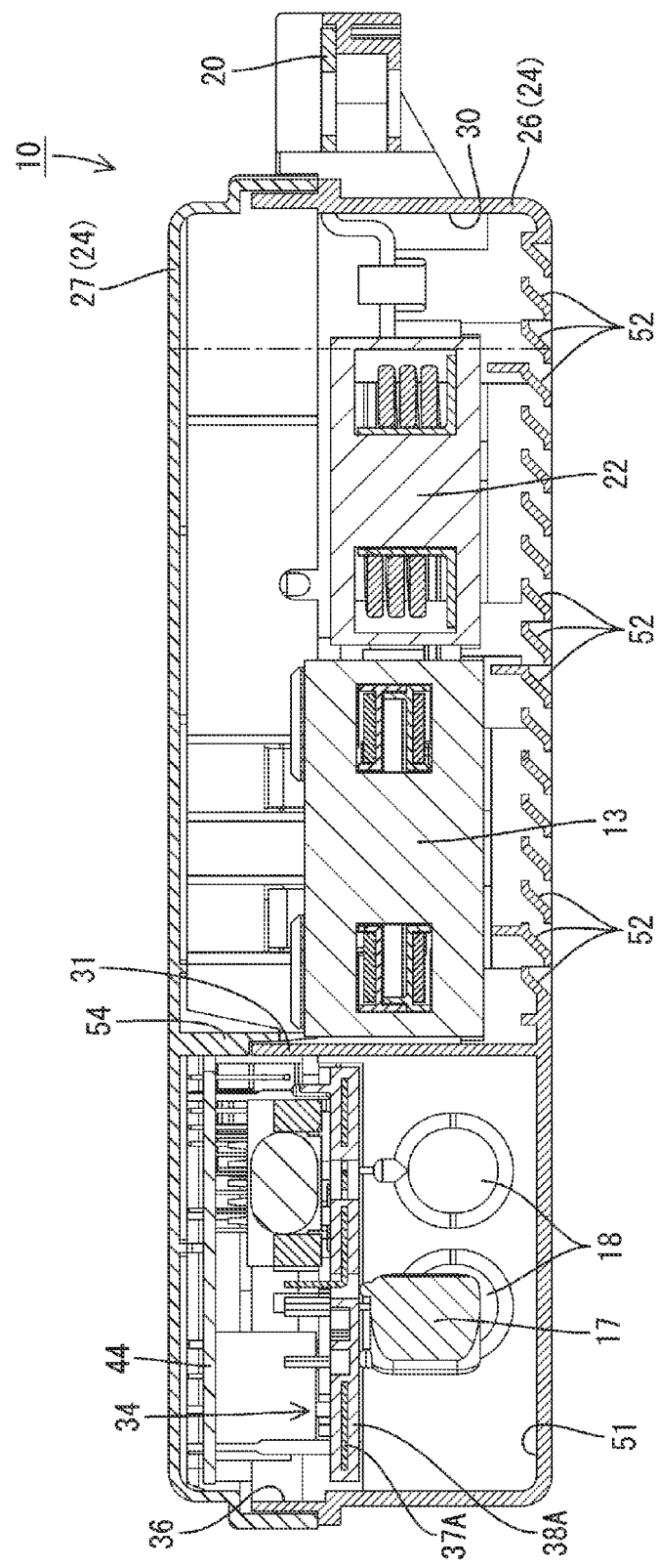
FIG. 10 is a cross sectional view of the DC-DC converter taken along line X-X of FIG. 3.

As shown in FIG. 10, formed on the under surface of the upper cover 27 is an upper-side partition 54 that protrudes downward from the under surface. The lower edge of the upper-side partition 54 abuts the upper edge of the lower-side partition 31 from above, thereby partitioning the first accommodating portion 30 from the second accommodating portion 36. Formed in the lower surface of the first accommodating portion 30 and penetrating the bottom wall of the lower case 26 are a plurality of inlet ports 52 in communication with the outside of the lower case 26. The inlet ports 52 are tilted with respect to the vertical direction. This limits entry of foreign materials, such as water, dust, etc., through the inlet ports 52.

As shown in FIG. 9, formed at the side edge of and penetrating the sidewall of the upper cover 27 are outlet ports 53 that place the first accommodating portion 30 in communication with the outside of the case 24. The areas to a side of the outlet ports 53 are covered with eaves 55 extending downward from the upper surface of the upper cover 27, such that the outlet ports 53 are opened downward. This limits entry of water from above through the outlet ports 53.

Operation and Effect of the Embodiment

The operation and effect of the present embodiment will be described hereafter. According to the present embodiment, the transformer 13 is accommodated in the first accommodating portion 30 and the switching elements 14 and the rectifying elements 15 are accommodated in the second accommodating portion 36. In this way, the transformer 13, which has a relatively high heat-resistant temperature, can be separately accommodated from the switching elements 14 and the rectifying elements 15, which have relatively low heat-resistant temperatures, in the case 24. This limits the heat generated by the transformer 13 from being transferred to the switching elements 14 and the rectifying elements 15. This allows for protection of the switching elements 14 and the rectifying elements 15, which have relatively low heat-resistant temperatures.

In addition, the inlet ports 52 and the outlet ports 53 are formed in the first accommodating portion 30, in which the transformer 13 is accommodated. This allows air flowing into the first accommodating portion 30 through the inlet ports 52 to cool the transformer 13 and be discharged through the outlet port 53 after heat from the transformer 13 is transferred to the air. This further limits the heat generated by the transformer 13 from being transferred to the switching elements 14 and the rectifying elements 15. This allows for reliable protection of the switching elements 14 and the rectifying elements 15, which have relatively low heat-resistant temperatures.

As the switching elements 14 and the rectifying elements 15 are thermally connected to the heat sink 25, the heat generated by the switching elements 14 and the rectifying elements 15 is swiftly transferred to the heat sink 25. This can limit the area in close proximity to the switching elements 14 and the rectifying elements 15 from reaching high temperature. The heat transferred to the heat sink 25 is thermally conducted through the heat sink 25 and dissipated to the outside of the case 24 from the radiator portion 47. This can limit the area in close proximity to the switching elements 14 and the rectifying elements 15 from reaching high temperature. This allows for reliable protection of the switching elements 14 and the rectifying elements 15, which have relatively low heat-resistant temperatures.

The heat sink 25 is thermally connected to the switching elements 14 and the rectifying elements 15 but not to the transformer 13. This allows the heat sink 25 to be smaller than if the heat sink 25 is thermally connected to all of the transformer 13, the switching elements 14, and the rectifying elements 15. Such miniaturization of the metal heat sink 25 allows for weight reduction of the DC-DC converter 10.

According to the present embodiment, the choke coil 22 connected to the secondary coil 12 is also accommodated in the first accommodating portion 30. This smoothes the output current of the DC-DC converter 10.

When energized, the choke coil 22 generates heat. As the choke coil 22 is accommodated in the first accommodating portion 30, this can limit the heat generated by the choke coil 22 from being transferred to the switching elements 14 and the rectifying elements 15.

Furthermore, the heat generated by the choke coil 22 is cooled by the air flowing into the case 24 through the inlet ports 52. The air, to which the heat from the choke coil 22 is transferred, is discharged from the outlet port 53 to the outside of the case 24. This further limits the heat generated by the choke coil 22 from being transferred to the switching elements 14 and the rectifying elements 15.

According to the present embodiment, the transformer 13 includes a ferrite magnetic core 32 and the choke coil 22 includes a powder magnetic core 33. As the foregoing powder magnetic core 33 experiences no degradation of magnetic performance as a choke coil when heated to relatively high temperature, the heat resistance of the choke coil 22 is improved.

Using ferrite magnetic core 32, the transformer 13 experiences no degradation of performance as a transformer when heated to relatively high temperature. This improves the overall heat resistance of the DC-DC converter 10.

According to the present embodiment, the input-side smoothing capacitor 17 and the capacitors 18 are connected to the primary coil 11, whereas the capacitor accommodating portion 51 for accommodating the input-side smoothing capacitor 17 and the capacitors 18 is formed in the part of the second accommodating portion 36 that is spaced apart from the switching elements 14 and the rectifying elements 15. In the DC-DC converter 10, the switching elements 14 turn on and off continuously and with high frequency. Due to this, the switching elements 14 have a relatively high heat generation rate. According to the present embodiment, the input-side smoothing capacitor 17 and the capacitors 18 can be protected from the heat generated by the switching elements 14.

According to the present embodiment, the case 24 includes a lower case 26 opened upward and an upper cover 27 that shuts the lower case 26 from above, and the upper edge of the lower-side partition 31 formed in the lower case 26 is brought into abutment from above with the lower edge of the upper-side partition 54 formed in the upper cover 27, thereby partitioning the first accommodating portion 30 from the second accommodating portion 36. In this way, the first accommodating portion 30 can be easily partitioned from the second accommodating portion 36 by assembling the lower case 26 and the upper cover 27 together.

Embodiment 2

Embodiment 2 will be described hereafter with reference to FIGS. 11-16. In the DC-DC converter 70 according to the present embodiment, an inner cover 73 is fitted in the first accommodating portion 72 of the lower case 71. The inner cover 73 is adapted to cover the first accommodating portion 72. The upper cover 74 is set on the lower case 71 in a manner that covers the second accommodating portion 81 of the lower case 71 and the inner cover 73.

Figure 11:
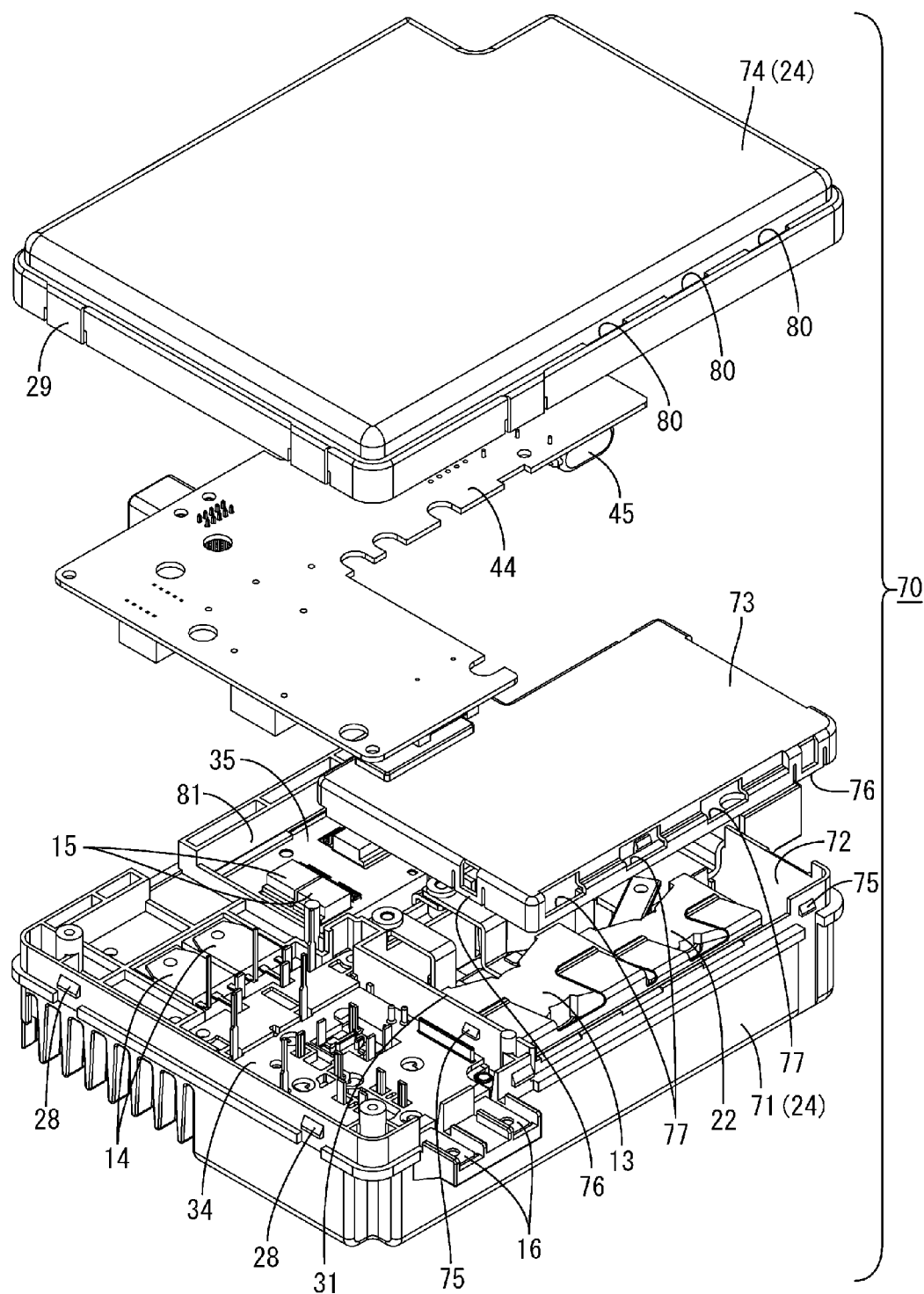
FIG. 11 is an exploded perspective view of a DC-DC converter according to Embodiment 2.
Figure 12:
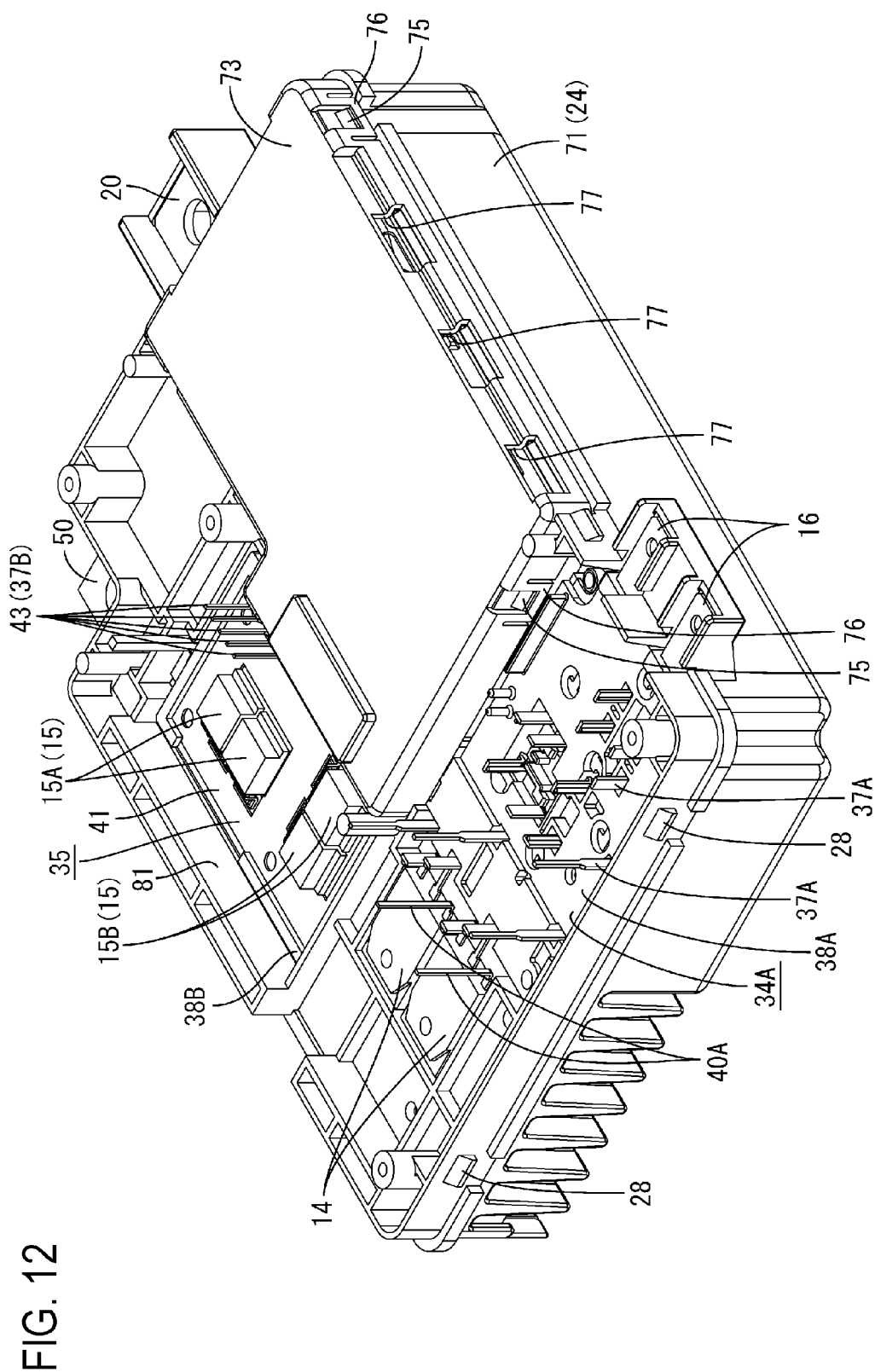
FIG. 12 is a perspective view showing the DC-DC converter with the upper cover and the second circuit board removed.
Figure 13:
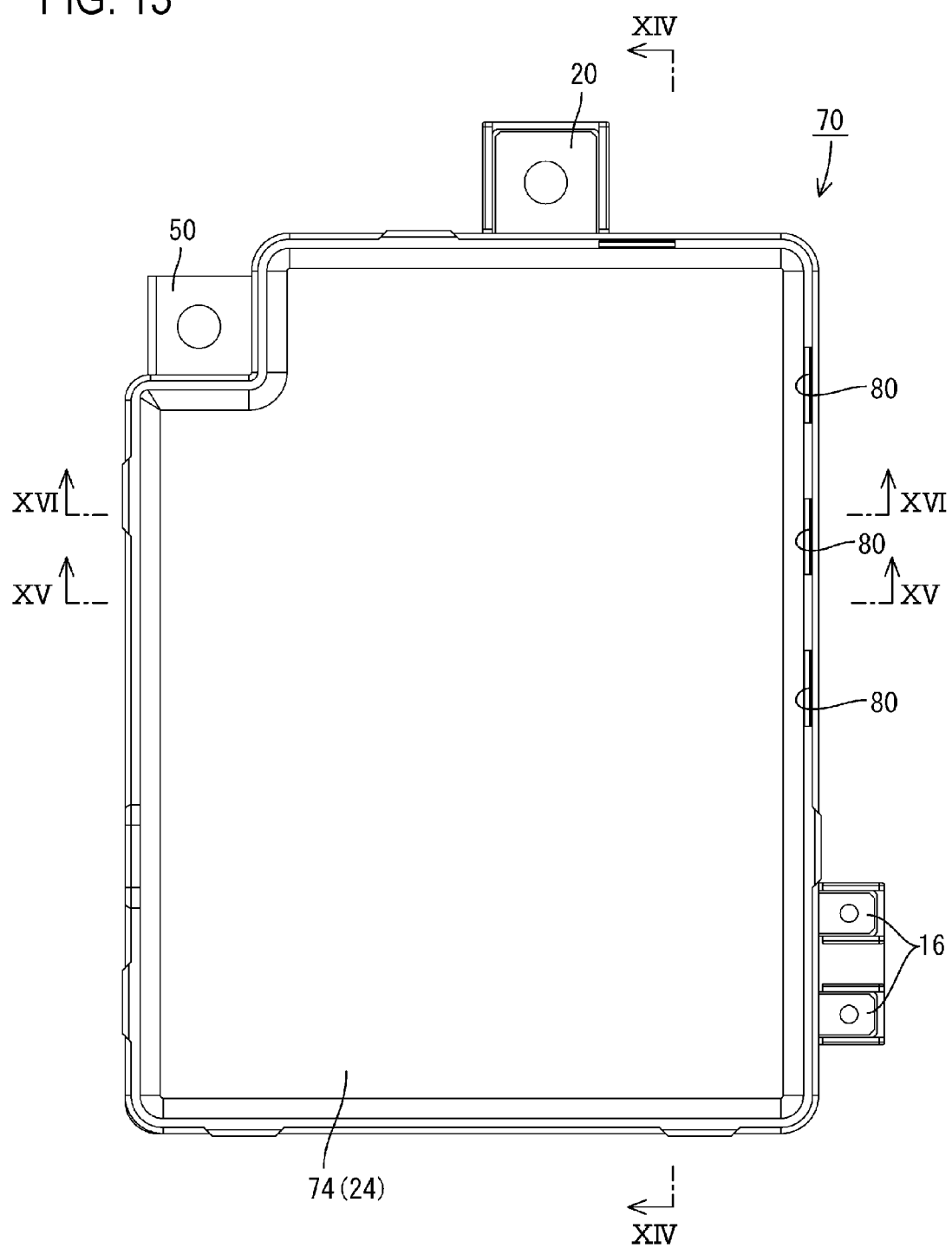
FIG. 13 is a plan view of the DC-DC converter.

As shown in FIGS. 11 and 12, the inner cover 73 is made of synthetic resin formed as a shallow dish with an approximately rectangular shape as seen from above. The inner cover 73 is integrally assembled by elastically engaging the inner cover lock portions 75 formed in the lower case 71 with the inner cover lock receiving portions 76 formed in the inner cover 73.

Formed in a sidewall of the inner cover 73 is a plurality of (three in the present embodiment) inner cover outlet ports 77 that penetrate the sidewall in the direction of the sidewall thickness and are spaced apart in the lengthwise direction.

Figure 14:
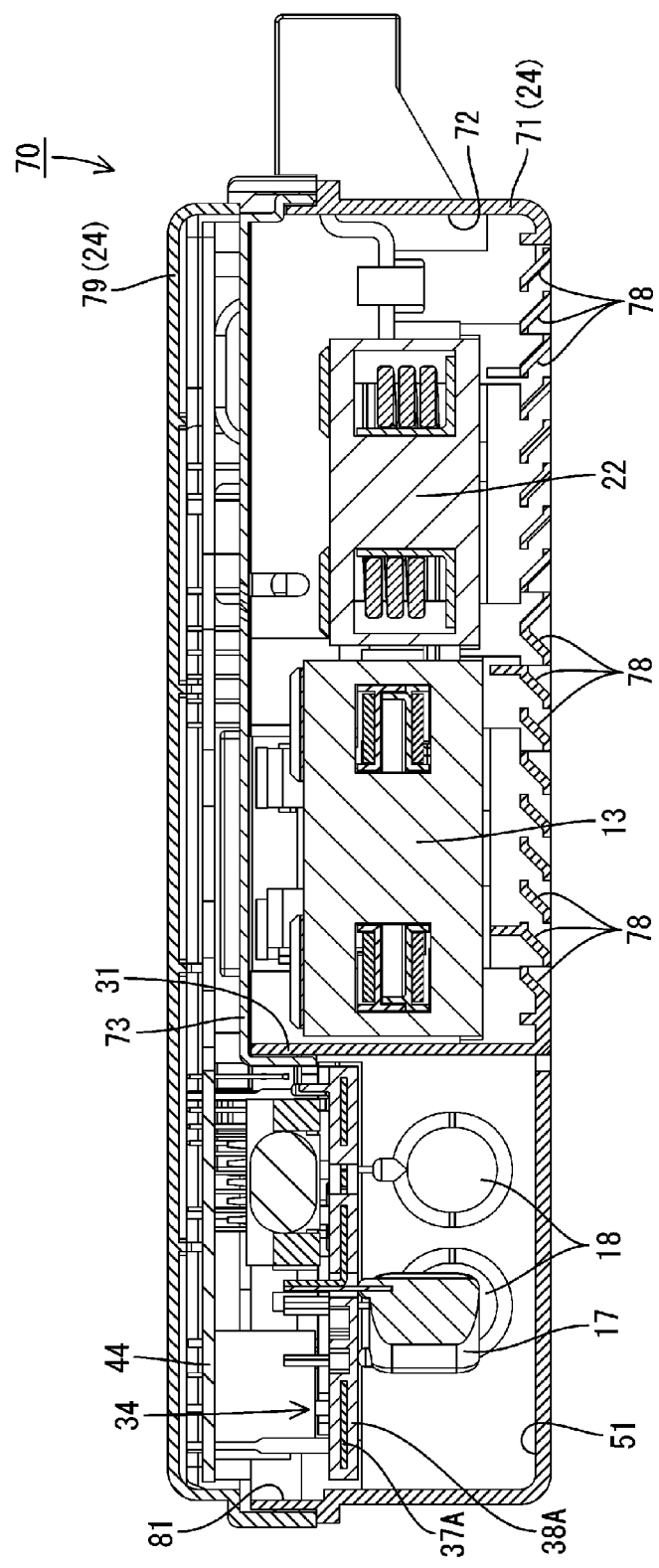
FIG. 14 is a cross sectional view taken along line XIV-XIV of FIG. 13.

As shown in FIG. 14, the first accommodating portion 72 is adapted to be covered with the inner cover 73 from above when the inner cover 73 is assembled to the lower case 71. A plurality of inlet ports 78 is formed in the bottom wall of the first accommodating portion 72.

Figure 15:
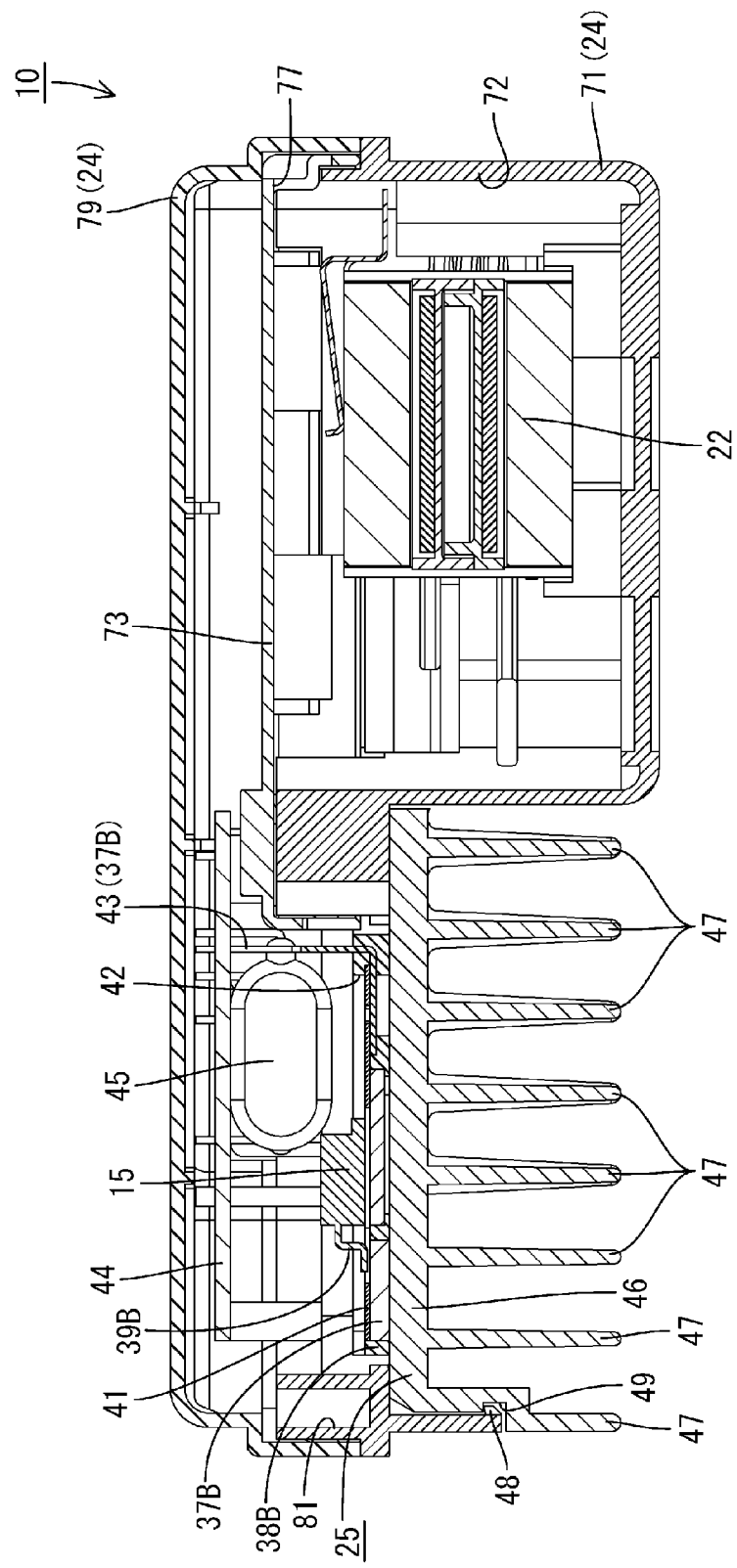
FIG. 15 is a cross sectional view taken along line XV-XV of FIG. 13.

As shown in FIG. 15, the inner cover outlet ports 77 formed in the sidewall of the inner cover 73 place the spaces inside the first accommodating portion 72, the inner cover 73, and the upper cover 79 in communication with one another. The inner cover outlet ports 77 are arranged out of alignment with the outlet ports 80 formed in the upper cover 79. Because of this arrangement, the areas adjacent to the inner cover outlet ports 77 are covered with the upper cover 27.

Figure 16:
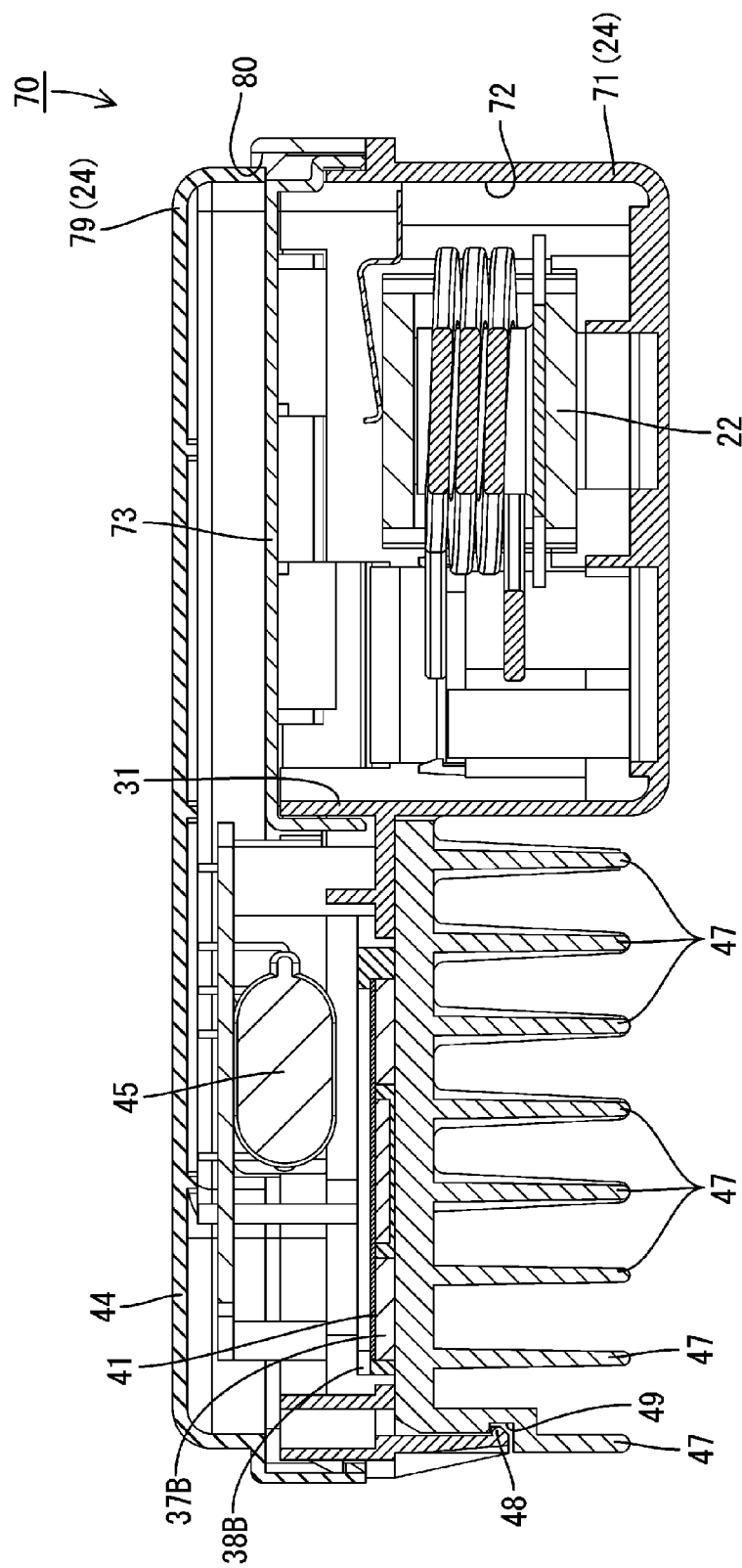
FIG. 16 is a cross sectional view taken along line XVI-XVI of FIG. 13.

As shown in FIGS. 11 and 16, formed in a sidewall of the upper cover 79 is a plurality of (three in the present embodiment) outlet ports 80 spaced apart in the lengthwise direction. The outlet ports 80 of the present embodiment are opened upward (see FIG. 16).

As described above, the inner cover outlet ports 77 are arranged out of alignment with the outlet ports 80. Because of this arrangement, the sidewall of the inner cover 73 is present in the locations below the outlet ports 80. This allows any water entering through the outlet ports 80 to get on the sidewall of the inner cover 73, thus limiting entry of the water into the interior of the inner cover 73.

As the structures other than the above described are similar to those of Embodiment 1, like members are designated by like reference symbols and description thereof is omitted.

Operation and Effect of the Embodiment

The operation and effect of the present embodiment will be described hereafter. According to the present embodiment, the first accommodating portion 72 can be partitioned from the second accommodating portion 36 by assembling the lower case 71 and the inner cover 73 together. This can reliably limit the heat generated by the transformer 13 and the choke coil 22 accommodated in the first accommodating portion 72 from being transferred to the switching elements 14 and the rectifying elements 15 in the second accommodating portion 36.

Moreover, as the inner cover outlet ports 77 place the spaces inside the first accommodating portion 72, the inner cover 73, and the upper cover 79 in communication with one another, the air in the first accommodating portion 72, after flowing out of the inner cover outlet ports 77, is discharged to the outside of the case 24 through the outlet ports 80 of the upper cover 79. This further limits the heat generated by the transformer 13 from being transferred to the switching elements 14 and the rectifying elements 15. This allows for reliable protection of the switching elements 14 and the rectifying elements 15, which have relatively low heat-resistant temperatures.

According to the present embodiment, the inner cover outlet ports 77 are arranged out of alignment with the outlet ports 80. Because of this arrangement, the sidewall of the inner cover 73 is present in the areas below the outlet ports 80. As a result, any water entering through the outlet ports 80 gets on the sidewall of the inner cover 73. In this way, if water enters the interior of the upper cover 79 through the outlet ports 80, the water is limited from entering the interior of the inner cover 73.

As described above, the present embodiment improves the heat dissipation of the choke coil 22 and the transformer 13 accommodated in the first accommodating portion 72 as well as the waterproofness of the first accommodating portion 72.

Other Embodiments

The present invention is not limited to the embodiments described in connection with the foregoing description and drawings. For example, the following embodiments also fall under the technical scope of the present invention.

(1) According to the embodiments, a choke coil 22 is accommodated in the case 24. The choke coil 22, however, may be omitted.

(2) According to the embodiments, the radiator portion 47 is formed as fins. The radiator portion 47 is not so limited but may be formed as a plate or in any shape as required.

(3) In Embodiment 2, the inner cover outlet ports 77 are arranged out of alignment with the outlet ports 53. Alternatively, the inner cover outlet ports 77 may be arranged in alignment with the outlet ports 53.

(4) In the embodiments, although FETs are used as the rectifying elements 15, diodes may also suffice. If diodes are used, signals from the controller 19 may be omitted.

(5) In the embodiments, the input-side smoothing capacitor 17 and the capacitors 18 are accommodated inside the capacitor accommodating portion 51. Alternatively, the capacitor accommodating portion 51 may be omitted, so that the input-side smoothing capacitor 17 and the capacitors 18 are accommodated in any location in the case 24.

(6) The magnetic core of the transformer 13 is not limited to the ferrite magnetic core 32. Furthermore, the magnetic core of the choke coil 22 is not limited to the powder magnetic core 33. The materials for these magnetic cores may be suitably selected according to the needs.

(7) In Embodiment 2, the second circuit board 44 may be disposed above the inner cover 73 or above both of the second accommodating portion 81 and the inner cover 73.

(8) In Embodiment 1, inlet ports 52 are formed in the lower case 26 and outlet ports 53 are formed in the upper cover 27. In Embodiment 2, inlet ports 52 are formed in the lower case 26, outlet ports 53 are formed in the upper cover 27, and inner cover outlet ports 77 are formed in the inner cover 73. Alternatively, the inlet ports 52, the outlet ports 53, and the inner cover outlet ports 77 may be omitted. Moreover, the positions of the inlet ports and the outlet ports may be reversed.

The invention claimed is:

1. A DC-DC converter, comprising:
    a transformer having a primary coil and a secondary coil;
    switching elements connected to the primary coil for switching the flow of electrical current to the primary coil;
    rectifying elements connected to the secondary coil;
    a case having (i) a first accommodating portion in which the transformer is accommodated and (ii) a second accommodating portion in which the switching elements and the rectifying elements are accommodated; and
    a metal heat sink attached to the case, the metal heat sink being thermally connected to the switching elements and the rectifying elements and having a radiator portion exposed on an outer surface of the case; wherein
    the case includes a lower case opened upward, an inner cover that covers the first accommodating portion formed in the lower case from above, and an upper cover that covers the lower case and the inner cover from above,
    the lower case is provided with inlet ports, the inlet ports placing the first accommodating portion in fluid communication with an exterior environment of the case,
    the inner cover is provided with inner cover outlet ports, the inner cover outlet ports being configured to provide fluid communication between: (i) a first space inside the first accommodating portion, and (ii) a second space inside the inner cover that is separate from the first space, and
    the upper cover is provided with outlet ports, the outlet ports placing the first accommodating portion in fluid communication with the exterior environment of the case.

2. The DC-DC converter according to claim 1, wherein the outlet ports are arranged out of alignment with the inner cover outlet ports.

3. The DC-DC converter according to claim 2, wherein a choke coil connected to the secondary coil is further accommodated in the first accommodating portion.

4. The DC-DC converter according to claim 2, wherein a capacitor is connected to the primary coil, and a capacitor accommodating portion in which the capacitor is accommodated is formed at a position in the second accommodating portion that is spaced apart from the switching elements and the rectifying elements.

5. The DC-DC converter according to claim 3, wherein the transformer includes a ferrite magnetic core and the choke coil includes a powder magnetic core.

6. The DC-DC converter according to claim 3, wherein a capacitor is connected to the primary coil, and a capacitor accommodating portion in which the capacitor is accommodated is formed at a position in the second accommodating portion that is spaced apart from the switching elements and the rectifying elements.

7. The DC-DC converter according to claim 5, wherein a capacitor is connected to the primary coil, and a capacitor accommodating portion in which the capacitor is accommodated is formed at a position in the second accommodating portion that is spaced apart from the switching elements and the rectifying elements.

8. The DC-DC converter according to claim 1, wherein a choke coil connected to the secondary coil is further accommodated in the first accommodating portion.

9. The DC-DC converter according to claim 8, wherein the transformer includes a ferrite magnetic core and the choke coil includes a powder magnetic core.

10. The DC-DC converter according to claim 8, wherein a capacitor is connected to the primary coil, and a capacitor accommodating portion in which the capacitor is accommodated is formed at a position in the second accommodating portion that is spaced apart from the switching elements and the rectifying elements.

11. The DC-DC converter according to claim 9, wherein a capacitor is connected to the primary coil, and a capacitor accommodating portion in which the capacitor is accommodated is formed at a position in the second accommodating portion that is spaced apart from the switching elements and the rectifying elements.

12. The DC-DC converter according to claim 1, wherein a capacitor is connected to the primary coil, and a capacitor accommodating portion in which the capacitor is accommodated is formed at a position in the second accommodating portion that is spaced apart from the switching elements and the rectifying elements.

13. A DC-DC converter, comprising:
a transformer having a primary coil and a secondary coil;
switching elements connected to the primary coil for switching the flow of electrical current to the primary coil;
rectifying elements connected to the secondary coil;
a case having (i) a first accommodating portion in which the transformer is accommodated and (ii) a second accommodating portion in which the switching elements and the rectifying elements are accommodated;
a metal heat sink attached to the case, the metal heat sink being thermally connected to the switching elements and the rectifying elements and having a radiator portion exposed on an outer surface of the case; and
the case includes a lower case opened upward and an upper cover that shuts the lower case from above, wherein
an upper edge of a lower-side partition formed in the lower case abuts with a lower edge of an upper-side partition formed in the upper cover, thereby partitioning the first accommodating portion from the second accommodating portion.

14. The DC-DC converter according to claim 13, wherein the case is provided with inlet ports and outlet ports that place the first accommodating portion in fluid communication with an exterior environment of the case.

15. The DC-DC converter according to claim 14, wherein a choke coil connected to the secondary coil is further accommodated in the first accommodating portion.

16. The DC-DC converter according to claim 14, wherein a capacitor is connected to the primary coil, and a capacitor accommodating portion in which the capacitor is accommodated is formed at a position in the second accommodating portion that is spaced apart from the switching elements and the rectifying elements.

17. The DC-DC converter according to claim 15, wherein the transformer includes a ferrite magnetic core and the choke coil includes a powder magnetic core.

18. The DC-DC converter according to claim 15, wherein a capacitor is connected to the primary coil, and a capacitor accommodating portion in which the capacitor is accommodated is formed at a position in the second accommodating portion that is spaced apart from the switching elements and the rectifying elements.

19. The DC-DC converter according to claim 17, wherein a capacitor is connected to the primary coil, and a capacitor accommodating portion in which the capacitor is accommodated is formed at a position in the second accommodating portion that is spaced apart from the switching elements and the rectifying elements.

20. The DC-DC converter according to claim 13, wherein a choke coil connected to the secondary coil is further accommodated in the first accommodating portion.

21. The DC-DC converter according to claim 20, wherein the transformer includes a ferrite magnetic core and the choke coil includes a powder magnetic core.

22. The DC-DC converter according to claim 20, wherein a capacitor is connected to the primary coil, and a capacitor accommodating portion in which the capacitor is accommodated is formed at a position in the second accommodating portion that is spaced apart from the switching elements and the rectifying elements.

23. The DC-DC converter according to claim 21, wherein a capacitor is connected to the primary coil, and a capacitor accommodating portion in which the capacitor is accommodated is formed at a position in the second accommodating portion that is spaced apart from the switching elements and the rectifying elements.

24. The DC-DC converter according to claim 13, wherein a capacitor is connected to the primary coil, and a capacitor accommodating portion in which the capacitor is accommodated is formed at a position in the second accommodating portion that is spaced apart from the switching elements and the rectifying elements.

* * * * *